(12) United States Patent
Akiyama (10) Patent No.: US 8,071,454 B1
(45) Date of Patent: Dec. 6, 2011

(54) METHOD FOR MANUFACTURING DIELECTRIC ISOLATION TYPE SEMICONDUCTOR DEVICE

(75) Inventor: Hajime Akiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/959,686

(22) Filed: Dec. 3, 2010

(30) Foreign Application Priority Data

May 13, 2010 (JP) ................... 2010-110892

(51) Int. Cl.
*H01L 21/331* (2006.01)
*H01L 21/76* (2006.01)

(52) U.S. Cl. ........ 438/353; 438/355; 438/359; 438/404; 438/405; 257/E21.088; 257/E21.544; 257/E21.564; 257/E21.53; 257/E21.532

(58) Field of Classification Search ........... 257/E21.088, 257/E21.544, E21.564, E21.53, E21.532
See application file for complete search history.

(56) References Cited

U.S. PATENT DOCUMENTS

| 4,688,069 A | * | 8/1987 | Joy et al. ................... 257/397 |
|---|---|---|---|
| 7,135,752 B2 | * | 11/2006 | Akiyama et al. ............... 257/501 |
| 7,408,228 B2 | * | 8/2008 | Hatade et al. ................. 257/369 |
| 7,781,292 B2 | * | 8/2010 | Gambino et al. ............. 438/294 |
| 2004/0119132 A1 | * | 6/2004 | Akiyama et al. ............... 257/501 |
| 2006/0138586 A1 | * | 6/2006 | Akiyama et al. ............... 257/506 |
| 2009/0140377 A1 | * | 6/2009 | Akiyama ....................... 257/506 |

FOREIGN PATENT DOCUMENTS

JP 2005-175296 6/2005

* cited by examiner

*Primary Examiner* — Mohsen Ahmadi
(74) *Attorney, Agent, or Firm* — Oblon, Spivak, McClelland, Maier & Neustadt, L.L.P.

(57) ABSTRACT

A method for manufacturing a dielectric isolation type semiconductor device comprises: forming a plurality of trenches in a first region on a major surface of a semiconductor substrate; forming a first dielectric layer on the major surface of the semiconductor substrate and a first thick dielectric layer in the first region by oxidizing a surface of the semiconductor substrate; bonding a semiconductor layer of a first conductive type to the semiconductor substrate via the first dielectric layer; forming a first semiconductor region by implanting an impurity into a part of the semiconductor layer above the first thick dielectric layer; forming a second semiconductor region by implanting an impurity of a second conductive type into a part of the semiconductor layer so as to surround the first semiconductor region separating from the first semiconductor region.

7 Claims, 10 Drawing Sheets

POTENTIAL DURING APPLYING
FORWARD BLOCKING VOLTAGE

METHOD FOR MANUFACTURING DIELECTRIC ISOLATION TYPE SEMICONDUCTOR DEVICE

BACKGROUND OF THE INVENTION

1. Field of the Invention

The present invention relates to a method for manufacturing a dielectric isolation type semiconductor device that can improve withstand voltage, and can prevent a semiconductor substrate from warping.

2. Background Art

In recent years, a dielectric isolation type semiconductor device wherein a semiconductor layer is bonded on a semiconductor substrate via a dielectric layer, and a power device is formed on the semiconductor layer has been proposed. However, in a conventional dielectric isolation type semiconductor device, the withstand voltage of the semiconductor device was limited depending on the thickness of the dielectric layer and the thickness of the semiconductor layer. In order to solve this problem, the formation of a thick dielectric layer locally on the major surface of a semiconductor substrate so as to contact the dielectric layer has been proposed (for example, refer to Japanese Patent Application Laid-Open No. 2005-175296).

SUMMARY OF THE INVENTION

However, if a thick dielectric layer was locally formed on the major surface of a semiconductor substrate, a problem of the warpage of the semiconductor substrate was caused.

In view of the above-described problems, an object of the present invention is to provide a method for manufacturing a dielectric isolation type semiconductor device that can improve withstand voltage, and can prevent a semiconductor substrate from warping.

According to the present invention, a method for manufacturing a dielectric isolation type semiconductor device comprises: forming a plurality of trenches in a first region on a major surface of a semiconductor substrate; forming a first dielectric layer on the major surface of the semiconductor substrate and a first thick dielectric layer in the first region by oxidizing a surface of the semiconductor substrate; bonding a semiconductor layer of a first conductive type to the semiconductor substrate via the first dielectric layer; forming a first semiconductor region by implanting an impurity into a part of the semiconductor layer above the first thick dielectric layer; forming a second semiconductor region by implanting an impurity of a second conductive type into a part of the semiconductor layer so as to surround the first semiconductor region separating from the first semiconductor region; forming a first main electrode connected to the first semiconductor region; forming a second main electrode connected to the second semiconductor region; and forming a lower electrode on a lower surface of the semiconductor substrate.

The present invention makes it possible to improve withstand voltage, and prevent a semiconductor substrate from warping.

Other and further objects, features and advantages of the invention will appear more fully from the following description.

DETAILED DESCRIPTION OF THE PREFERRED EMBODIMENTS

A dielectric isolation type semiconductor device according to the embodiments of the present invention will be described with reference to the drawings. The same components will be denoted by the same symbols, and the repeated description thereof may be omitted.

First Embodiment

Figure 1:
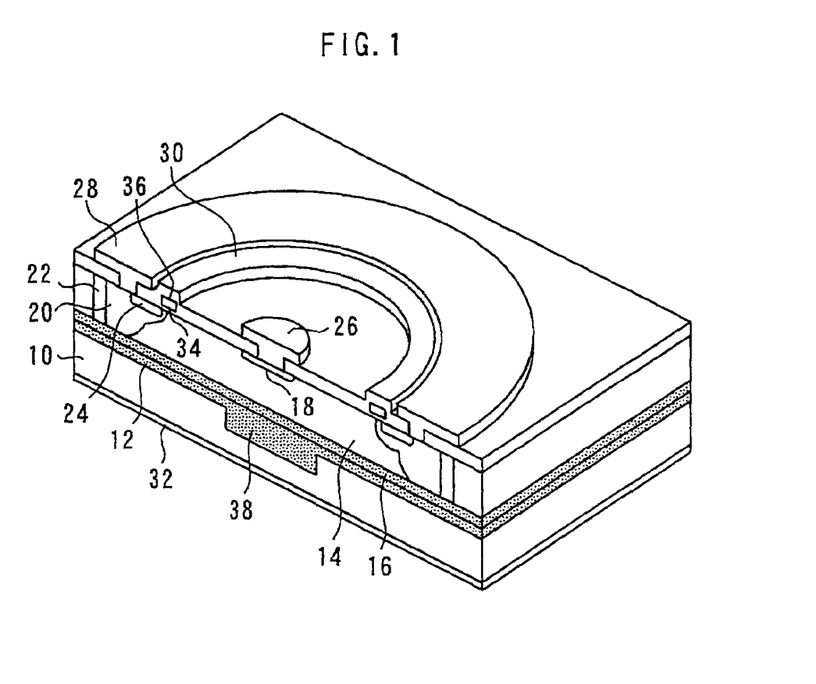
FIG. 1 is a sectional perspective view showing a dielectric isolation type semiconductor device according to the first embodiment.
Figure 2:
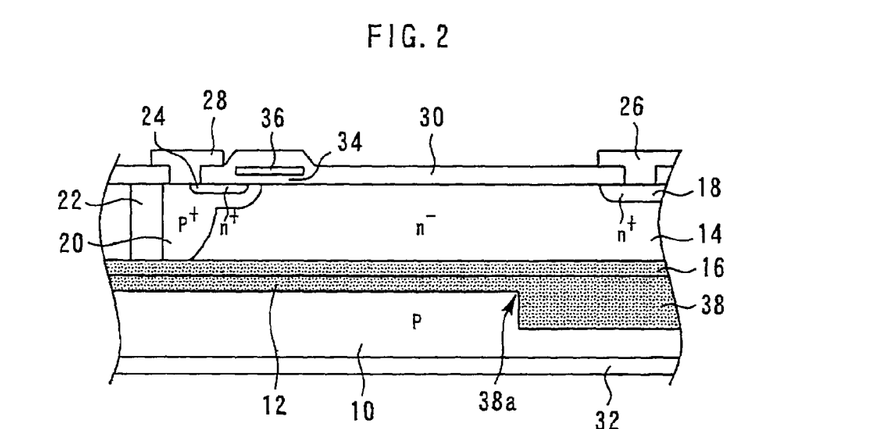
FIG. 2 is a sectional view showing the main part of the dielectric isolation type semiconductor device according to the first embodiment.

FIG. 1 is a sectional perspective view showing a dielectric isolation type semiconductor device according to the first embodiment; and FIG. 2 is a sectional view showing the main part of the dielectric isolation type semiconductor device according to the first embodiment.

A dielectric layer 12 is formed on the major surface of a p-type silicon substrate 10. A dielectric layer 16 is formed on the major surface of an $n^-$-type semiconductor layer 14. The dielectric layer 12 and the dielectric layer 16 are tightly joined, and the $n^-$-type semiconductor layer 14 is bonded to the major surface of a p-type silicon substrate 10. The dielectric layers 12 and 16 dielectrically separate the p-type silicon substrate 10 and the $n^-$-type semiconductor layer 14.

An n'-type semiconductor region 18 having a higher impurity concentration than the $n^-$-type semiconductor layer 14 is selectively formed on the surface of the $n^-$-type semiconductor layer 14. A $p^+$-type semiconductor region 20 is selectively formed on the surface of the $n^-$-type semiconductor layer 14 so as to separate from the $n^+$-type semiconductor region 18 and surround the n+-type semiconductor region 18. A ring-like trench separator 22 is formed on the n−-type semiconductor layer 14 so as to surround the peripheral edge of the p+-type semiconductor region 20 and reaches to the dielectric layer 16 from the surface of the n−-type semiconductor layer 14. An n+-type semiconductor region 24 is selectively formed on the surface of the p+-type semiconductor region 20

A main electrode 26 is connected to the n+-type semiconductor region 18. A main electrode 28 is connected to the p+-type semiconductor region 20 and the n+-type semiconductor region 24. The main electrode 26 and the main electrode 28 are electrically insolated from one another by an insulating film 30. A lower electrode 32 is formed on the lower surface of the p-type silicon substrate 10.

A gate electrode 36 is formed in the vicinity of the main electrode 28 and on the n−-type semiconductor layer 14 on the main electrode 26 via a gate insulating film 34. A gate electrode 36 faces the p+-type semiconductor region 20, the n+-type semiconductor region 24, and the n−-type semiconductor layer 14 via the gate insulating film 34. This semiconductor device functions as an n-channel MOS transistor that uses the main electrode 26 as a drain electrode and the main electrode 28 as a source electrode. Furthermore, in the present embodiment, a thick dielectric layer 38 is formed on the major surface of the p-type silicon substrate 10 immediately below the main electrode 26.

Figure 3:
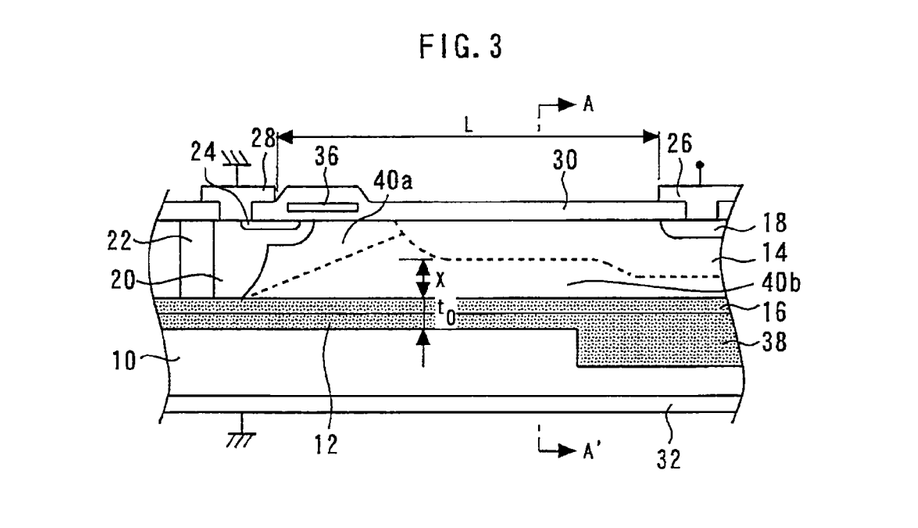
FIG. 3 is a sectional view for illustrating the maintaining operations of the forward withstand voltage of the dielectric isolation type semiconductor device according to the first embodiment.

FIG. 3 is a sectional view for illustrating the maintaining operations of the forward withstand voltage of the dielectric isolation type semiconductor device according to the first embodiment. When the main electrode 28 and the lower electrode 32 are set up to the grounding potential (0 V), and a positive voltage (+V) is applied to the main electrode 26 and gradually elevated, a depletion layer 40a extends from the p-n junction between the n−-type semiconductor layer 14 and the p+-type semiconductor region 20.

At this time, the p-type silicon substrate 10 functions as a field plate fixed to the grounding potential via the dielectric layers 12, 16, and the thick dielectric layer 38. Therefore, in addition to the depletion layer 40a, a depletion layer 40b extends upward from the interface between the n−-type semiconductor layer 14 and the dielectric layer 16. Thereby, the depletion layer 40a easier extends toward the main electrode 26, and the electric field at the p-n junction between the n−-type semiconductor layer 14 and p+-type semiconductor region 20 is released. This effect is generally known as the RESURF (reduced surface field) effect.

Figure 4:
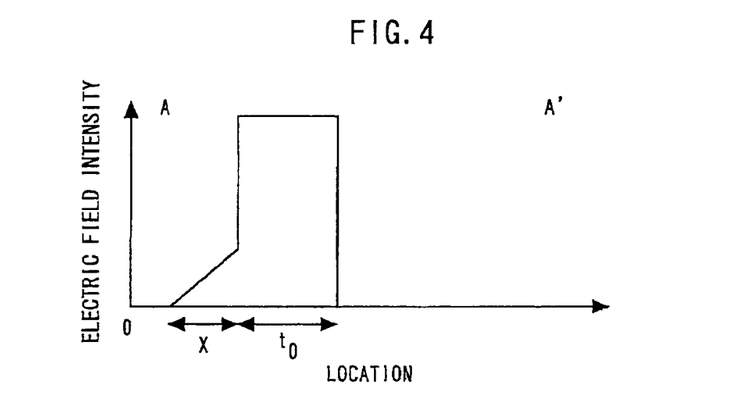
FIG. 4 is a graph showing the electric field intensity distribution along the line A-A' in FIG. 3.

FIG. 4 is a graph showing the electric field intensity distribution along the line A-A' in FIG. 3. The abscissa indicates the locations along the line A-A', and the ordinate indicates the electric field intensities. The origin of the abscissa is in the upper surface of the n−-type semiconductor layer 14. The line A-A' is sufficiently separated from the p+-type semiconductor region 20. The total voltage drop V at the line A-A' is represented by the following equation.

$$V = q \cdot N/(\epsilon_2 \cdot \epsilon_o) \times (x^2/2 + \epsilon_2 \cdot t_o \cdot x/\epsilon_3) \quad (1)$$

Here, q is an electric charge. N is the impurity concentration [cm$^{-3}$] of the n−-type semiconductor layer 14, $\epsilon_2$ is the relative permittivity of the n−-type semiconductor layer, $\epsilon_o$ is the permittivity of a vacuum [C·V$^{-1}$·cm$^{-1}$], x is the thickness of the depletion layer 40b, $t_o$ is the total thickness of the dielectric layers 12 and 16, and $\epsilon_3$ is the relative permittivity of the dielectric layer.

As seen from this equation, when the total thickness $t_o$ of the dielectric layers 12 and 16 is increased while maintaining the total voltage drop V to be equal, the thickness x of the depletion layer 40b is shortened. This means that the RESURF is weakened.

On the other hand, under the withstand voltage conditions wherein no avalanche breakdown occurs due to the electric field concentration in the p-n junction between the n−-type semiconductor layer 14 and the p+-type semiconductor region 20, and the electric field concentration at the interface between the n−-type semiconductor layer 14 and the n+-type semiconductor region 18, the withstand voltage of a semiconductor device is determined by the avalanche breakdown due to electric field concentration at the interface between the n−-type semiconductor layer 14 and the dielectric layer 16 immediately below the n+-type semiconductor region 18.

In order to constitute a semiconductor device so that such withstand voltage conditions are satisfied, the distance L between the p+-type semiconductor region 20 and the n+-type semiconductor region 18 is set up to be sufficiently long, and the thickness d and the impurity concentration N of the n−-type semiconductor layer 14 are optimized. For example, to obtain 600 V of withstand voltage, the distance L is designed to be about 70 to 100 μm.

Figure 5:
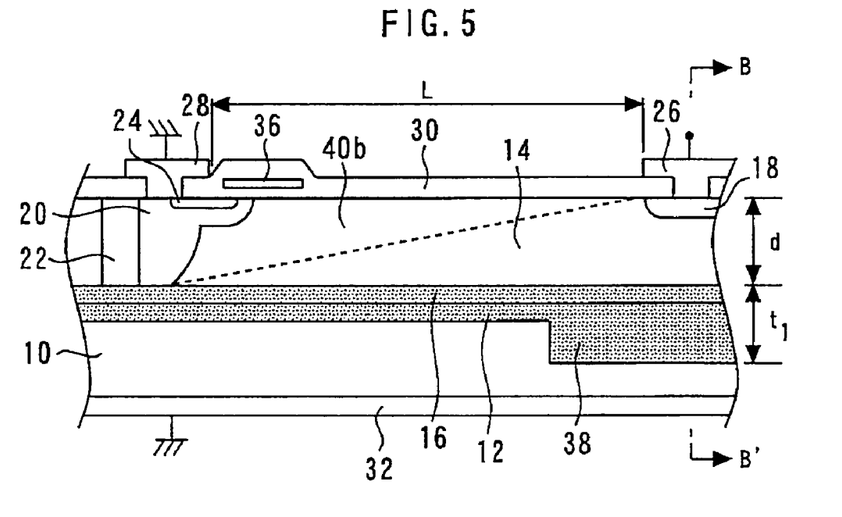
FIG. 5 is a sectional view for illustrating the maintaining operation of forward withstand voltage of a dielectric isolation type semiconductor device according to the first embodiment under the withstand voltage conditions.

FIG. 5 is a sectional view for illustrating the maintaining operation of forward withstand voltage of a dielectric isolation type semiconductor device according to the first embodiment under the withstand voltage conditions. It has been known that under the above-described withstand voltage conditions, when the interface between the n−-type semiconductor layer 14 and the dielectric layer 16 to the surface of the n−-type semiconductor layer 14 are depleted, the electric field concentration at the interface between the n−-type semiconductor layer 14 and the dielectric layer 16 exactly satisfies the avalanche conditions. The depletion layer 40b reaches to the n+-type semiconductor region 18, and the entire n−-type semiconductor layer 14 is depleted.

The withstand voltage V under this withstand voltage condition is represented by the total voltage drop immediately below the n+-type semiconductor region 18 (B-B' in FIG. 5), and is represented by Equation (2) below:

$$V = E_{cr} \cdot (d/2 + \epsilon_2 \cdot t_1/\epsilon_3) \quad (2)$$

Here, $E_{cr}$ is the critical electric field intensity that causes avalanche breakdown, $t_1$ is the total thickness (cm) of the dielectric layers 12 and 16, and the thick dielectric layer 38. The thickness of the n+-type semiconductor region 18 is ignored.

Figure 6:
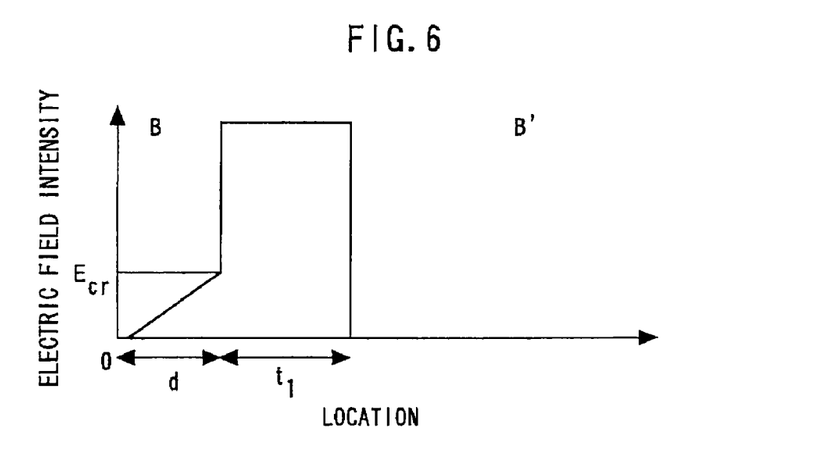
FIG. 6 is an explanatory graph showing the electric field intensity distribution along the line B-B' in FIG. 5.

FIG. 6 is an explanatory graph showing the electric field intensity distribution along the line B-B' in FIG. 5. The abscissa indicates the locations along the line B-B', and the ordinate indicates the electric field intensity. The origin of the abscissa is the upper surface of the n−-type semiconductor layer 14. The electric field intensity at the interface between the n−-type semiconductor layer 14 and the dielectric layer 16 (the location of a distance d from the upper surface of the n−-type semiconductor layer 14 toward the lower electrode 32) reaches the critical electric field intensity Ecr.

As seen from the above equations (1) and (2), by setting up the total thickness $t_o$ of the dielectric layers 12 and 16 to be thin so as not to destroy the RESURF effect. In addition, the total thickness t1 of the dielectric layers is set up to be thick, the voltage drop can be minimized, and the withstand voltage can be improved within the range of forming the thick dielectric layer 38.

Figure 7:
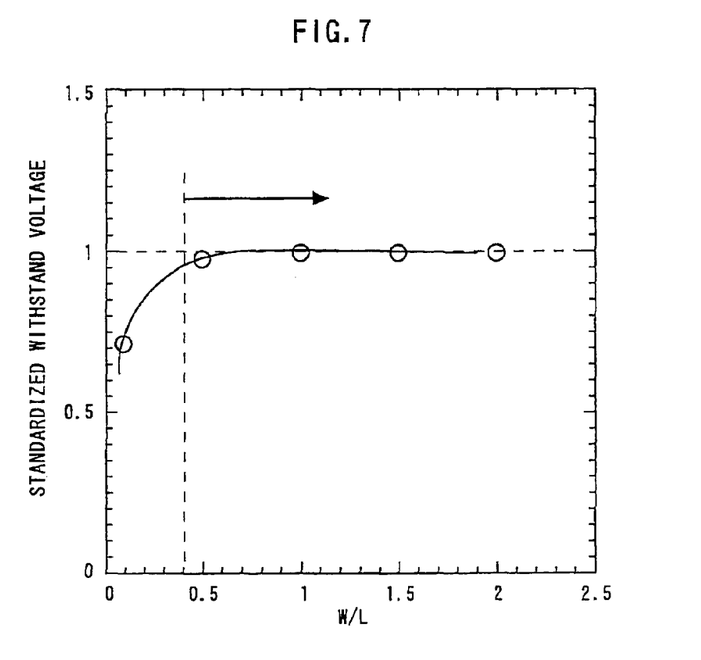
FIG. 7 is a graph showing the relationship between W/L and withstand voltage in a dielectric isolation type semiconductor device according to the first embodiment.

FIG. 7 is a graph showing the relationship between W/L and withstand voltage in a dielectric isolation type semiconductor device according to the first embodiment. The ordinate indicates standardized withstand voltages, and the abscissa indicates W/L. W is the width of the thick dielectric layer 38, and L is the distance between the main electrode 28 and the main electrode 26. As seen from FIG. 7, in the region where the width W is less than 40% the distance L, the withstand voltage becomes drastically elevated with increase in the width W. Furthermore, if the width W exceeds 40% the distance L, a substantially prescribed withstand voltage can be obtained. For this reason, it is desirable that the edge 38a of the thick dielectric layer 38 be placed at the location 40% or more of the distance L from the main electrode 26 side toward the main electrode 28 in consideration of the withstand voltage.

Next, a method for manufacturing a dielectric isolation type semiconductor device according to the first embodiment will be described. FIGS. 8 to 11 are sectional views for illustrating the method for manufacturing a dielectric isolation type semiconductor device according to the first embodiment.

Figure 8:
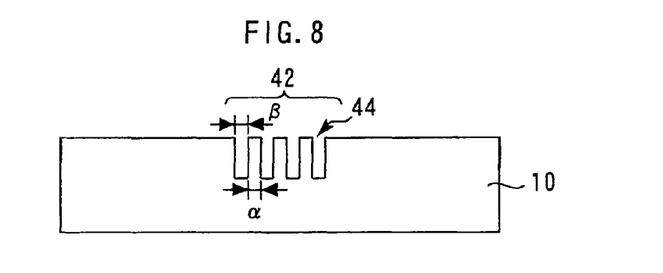
FIGS. 8 to 11 are sectional views for illustrating the method for manufacturing a dielectric isolation type semiconductor device according to the first embodiment.

First, as shown in FIG. 8, a plurality of trenches 44 are formed in the region 42 on the major surface of a p-type silicon substrate 10. Here, the width α of the region between the trenches 44 is made smaller than 1 μm and the opening width β of the trench 44 is made to be about 1.5×α.

Figure 9:
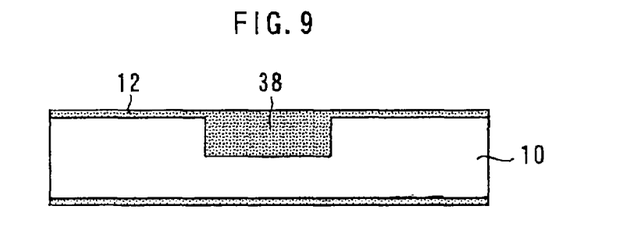

Next, as shown in FIG. 9, the entire surface of the p-type silicon substrate 10 is thermally oxidized. Here, the thickness of the oxide film is made to be 0.5×α or more, and both the regions between the trenches 44 and the regions in the trenches 44 are filled with oxide films. Thereby, a dielectric layer 12 is formed on the major surface of the p-type silicon substrate 10, and the thick dielectric layer 38 is formed in the region 42. Thereafter, the surfaces of the dielectric layer 12 and the thick dielectric layer 38 are planarized by polishing or spin etching.

Figure 10:
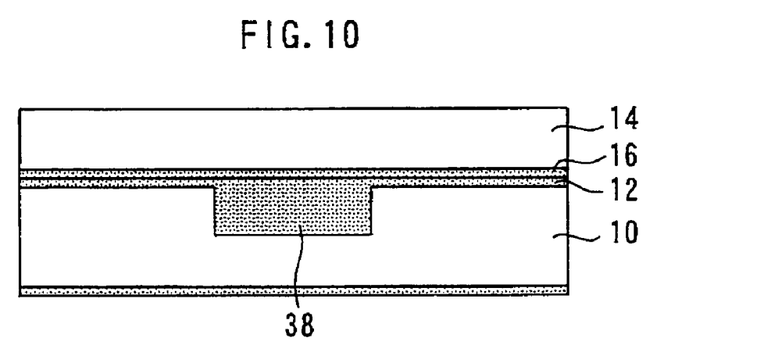

Next, as shown in FIG. 10, the surface of the n⁻-type semiconductor layer 14 is oxidized by oxidation treatment to form a dielectric layer 16 on the major surface of the n⁻-type semiconductor layer 14. Then, the dielectric layer 12 is tightly joined to the dielectric layer 16, and the n⁻-type semiconductor layer 14 is bonded to the p-type silicon substrate 10 via the dielectric layers 12 and 16. Furthermore, a heat treatment, such as pyro-oxidation, is performed for example, at 1200° C. for 3 hours to improve bonding strength. Then, the surface of the n⁻-type semiconductor layer 14 is ground and polished to be a prescribed thickness. This yields an SOI (Silicon On Insulator) structure.

Figure 11:
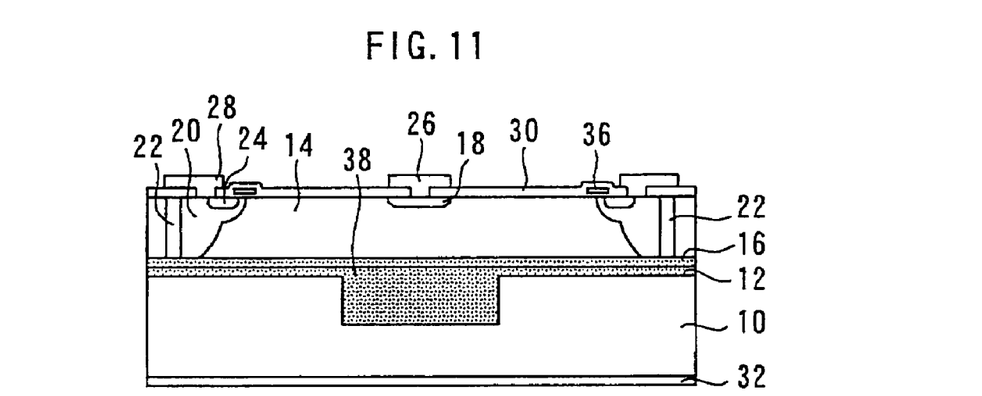

Next, as shown in FIG. 11, an oxide film (not shown) is formed on the n⁻-type semiconductor layer 14, the region of the oxide film corresponding to the trench separator 22 is removed, and the n⁻-type semiconductor layer 14 is etched using the oxide film as a mask to form channels extending to the dielectric layer 16. Then, after removing the oxide film, an oxide film (not shown) is formed again by thermal oxidation to bury the channels, and the oxide film is etched back to form trench separators 22.

Next, an oxide film (not shown) is formed on the n⁻-type semiconductor layer 14, and the oxide film is subjected to patterning. Then, an n-type impurity, such as phosphorus, is implanted into a part of the n⁻-type semiconductor layer 14 above the thick dielectric layer 38 using the patterned oxide film as a mask, and annealing is performed to form an n⁺-type semiconductor region 18. Then, a p-type impurity, such as boron, is implanted into a part of the n⁻-type semiconductor layer 14 so as to surround the n⁺-type semiconductor region 18 separating from the n⁺-type semiconductor region 18 to form the p⁺-type semiconductor region 20. Then, by similarly performing ion implantation and annealing, an n⁺-type semiconductor region 24 is formed. Furthermore, an insulating film 30, a gate electrode 36, a main electrode 26 connected to the n⁺-type semiconductor region 18, and a main electrode 28 connected to the p⁺-type semiconductor region 20 are formed.

Finally, the entire lower surface of the p-type silicon substrate 10 is subjected to a polishing treatment to remove the oxide film formed on the lower surface of the p-type silicon substrate 10. Then, a lower electrode 32 composed of a vapor-deposited metal layer (for example, Ti/Ni/Au three-layer vapor-deposited layer or the like) is formed on the lower surface of the p-type silicon substrate 10. By the above-described process, the dielectric isolation type semiconductor device according to the first embodiment is manufactured.

As described above, in the present embodiment, a plurality of trenches 44 are locally formed on the major surface of the p-type silicon substrate 10, and this region is oxidized to form the thick dielectric layer 38. Therefore, even if the oxidized part expands, strain is relieved by the trenches 44. Hence, the warpage of the p-type silicon substrate 10 can be prevented.

Second Embodiment

Figure 12:
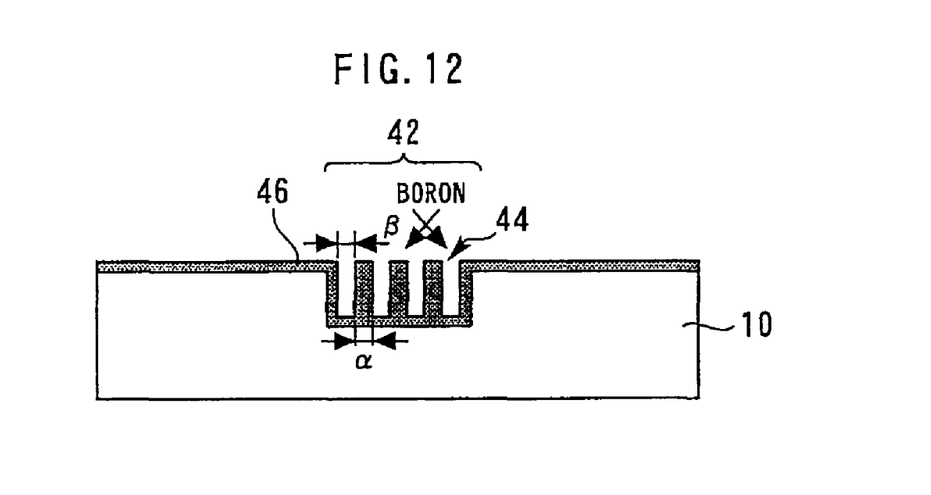
FIGS. 12 to 14 are sectional view for illustrating the method for manufacturing the dielectric isolation type semiconductor device according to the second embodiment.
Figure 13:
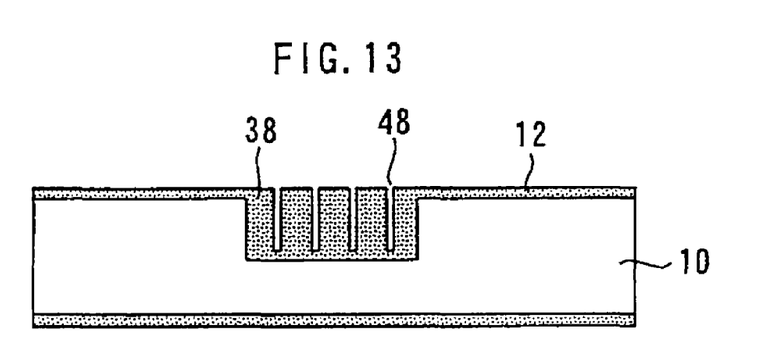
Figure 14:
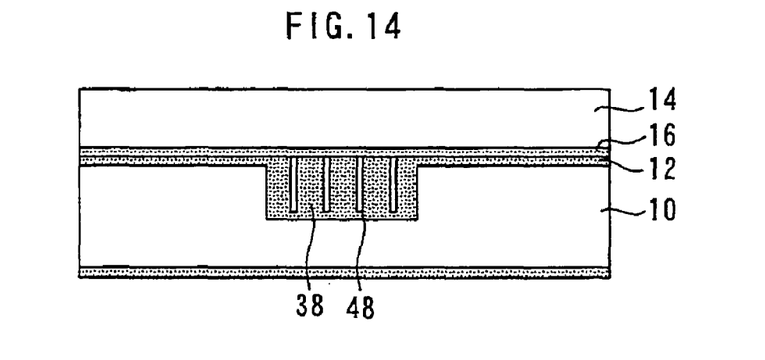

A method for manufacturing a dielectric isolation type semiconductor device according to the second embodiment will be described. The second embodiment differs from the first embodiment in the forming process of trenches 44 and the thick dielectric layer 38. FIGS. 12 to 14 are sectional view for illustrating the method for manufacturing the dielectric isolation type semiconductor device according to the second embodiment.

First, as shown in FIG. 12, a plurality of trenches 44 are formed on the region 42 in the major surface of the p-type silicon substrate 10. Here, the width α of the region between the trenches 44 is made to be smaller than 1 μm, and the opening part β of the trenches 44 is made to be about 1.5×α. Then, boron is rotation-implanted on the entire upper surface of the p-type silicon substrate 10 including the sidewalls and the bottoms of the trenches 44 and heat diffusion is conducted to form a p-type high-concentration diffusion region 46 integrally in the region 42.

Next, as shown in FIG. 13, the surface of the p-type silicon substrate 10 is oxidized by enhanced oxidation to form the dielectric layer 12 on the major surface of the p-type silicon substrate 10. Here, the thickness of the oxide film is made to be 0.5×α or more, and the p-type high-concentration diffusion region 46 is entirely made porous and oxidized to form a thick dielectric layer 38 in the region 42. In the second embodiment, however, the plurality of trenches 44 are slightly left on the thick dielectric layer 38 as voids 48. Thereafter, the surface of the dielectric layer 12 and the thick dielectric layer 38 are planarized by polishing or spin etching.

Next, as shown in FIG. 14, the surface of the n⁻-type semiconductor layer 14 is oxidized by an oxidation treatment to form a dielectric layer 16 on the major surface of the n⁻-type semiconductor layer 14. Then, the dielectric layer 12 and the dielectric layer 16 are tightly joined, and the n⁻-type semiconductor layer 14 is bonded to the p-type silicon substrate 10 under a reduced pressure. Furthermore, the pressure is raised from the reduced-pressure state, and the bonded portion is locally heated by lamp annealing or the like to improve the bonding strength. Then, the surface of the n⁻-type semiconductor layer 14 is ground and polished to have a prescribed thickness. The subsequent process is identical to the process of the first embodiment.

As described above, in the present embodiment, the plurality of trenches 44 are slightly left on the thick dielectric layer 38 as voids 48. Thereby, the planarity of the surface of the thick dielectric layer 38 can be secured. Therefore, the joining state of the p-type silicon substrate 10 and the n⁻-type semiconductor layer 14 can be improved, and the joining strength can be elevated.

Furthermore, when the n⁻-type semiconductor layer 14 is bonded to the p-type silicon substrate 10, if the entire substrate is heated to a high temperature for a long time, the thick dielectric layer 38 composed of a porous oxide film may be deformed. In the present embodiment, therefore, the bonded portion is locally heated by lamp annealing or the like. Thereby, a minimum thermal profile required for improving the bonding strength can be obtained.

Third Embodiment

A method for manufacturing a dielectric isolation type semiconductor device according to the third embodiment will be described. FIGS. 15 to 18 are sectional views for illustrating the method for manufacturing the dielectric isolation type semiconductor device according to the third embodiment.

First, in the same manner as in the first embodiment, a dielectric layer 12 and a thick dielectric layer 38 are formed on a p-type silicon substrate 10.

Figure 15:
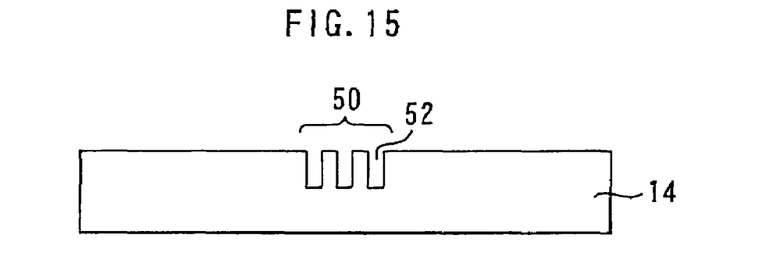
FIGS. 15 to 18 are sectional views for illustrating the method for manufacturing the dielectric isolation type semiconductor device according to the third embodiment.
Figure 16:
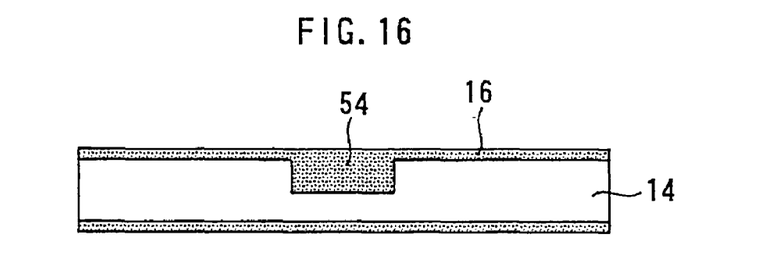

Next, as shown in FIG. 15, a plurality of trenches 52 are formed in the region 50 on the major surface of the n⁻-type semiconductor layer 14. Then, as shown in FIG. 16, the surface of the n⁻-type semiconductor layer 14 is oxidized by thermally oxidizing the entire wafer. Thereby, a dielectric layer 16 is formed on the major surface of the n⁻-type semiconductor layer 14, and a thick dielectric layer 54 is formed in the region 50. Thereafter, the surfaces of the dielectric layer 16 and the thick dielectric layer 54 are planarized by polishing or spin etching.

Figure 17:
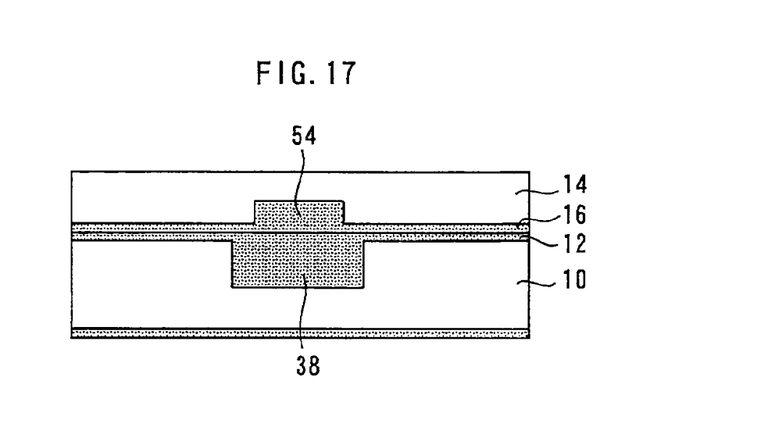

Next, as shown in FIG. 17, alignment is performed so that the thick dielectric layer 38 and the thick dielectric layer 54 face one another, and the dielectric layer 12 and the dielectric layer 16 are tightly joined, and the n⁻-type semiconductor layer 14 is bonded to the p-type silicon substrate 10 under a normal pressure or a reduced pressure. Furthermore, the bonded portion is locally heated by lamp annealing or the like to improve the bonding strength. Then, the surface of the n⁻-type semiconductor layer 14 is ground and polished to have a prescribed thickness.

Figure 18:
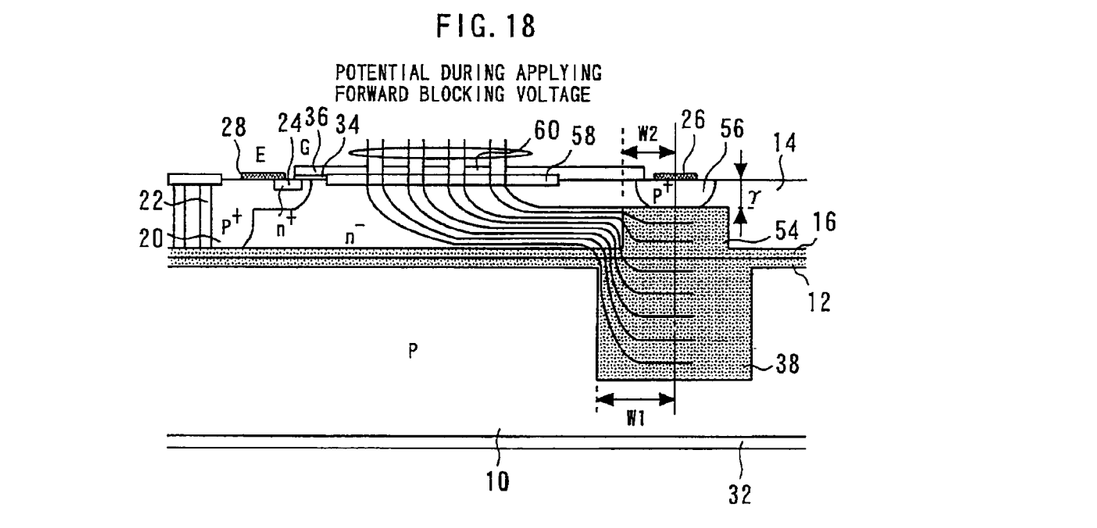

Next, as shown in FIG. 18, an oxide film (not shown) is formed on the n⁻-type semiconductor layer 14, the region of the oxide film corresponding to the trench separator 22 is removed, and the n⁻-type semiconductor layer 14 is etched using the oxide film as a mask to form a channel reaching the dielectric layer 16. Then, after removing the oxide film, an oxide film (not shown) is formed again by thermal oxidation to fill the channel and the oxide film is etched back to form the trench separator 22.

Next, an oxide film (not shown) is formed on the n⁻-type semiconductor layer 14, and the patterning of the oxide film is performed. Then, boron implantation and annealing are performed using the patterned oxide film as a mask to form a p⁺-type collector diffusion layer 56 and a p⁺-type semiconductor region 20. Then, ion implantation and annealing are performed in the similar manner to form an n⁺-type semiconductor region 24. A field oxide film 58 is formed on the surface of the n⁻-type semiconductor layer 14 between the p'-type semiconductor region 20 and the p⁺-type collector diffusion layer 56. Furthermore, a gate electrode 36, a main electrode 26 connected to the p⁺-type collector diffusion layer 56, and a main electrode 28 connected to the p⁺-type semiconductor region 20 are formed. In order to capacitively separate between the main electrode 26 and the main electrode 28 to evenly distribute potentials, a plurality of electrodes 60 in floating states are formed on the field oxide film 58.

Finally, the entire lower surface of the p-type silicon substrate 10 is subjected to a polishing treatment, the oxide film formed on the lower surface of the p-type silicon substrate 10 is removed, and a lower electrode 32 composed of a vapor-deposited metal layer (for example, a Ti/Ni/Au three-layer vapor-deposited layer or the like) is formed. By the above-described process, the dielectric isolation type semiconductor device according to the third embodiment is manufactured.

This semiconductor device functions as a horizontal device NP-type IGBT wherein the main electrode 26 is used as the collector electrode and the main electrode 28 is used as the emitter electrode. Because of an NP-type, the On-voltage of the IGBT elevates at high temperatures, and the current distribution becomes even, and therefore this semiconductor device is advantageous for parallel operations.

In the present embodiment, in the same manner as in the first embodiment, a plurality of trenches 44 are locally formed on the major surface of the p-type silicon substrate 10, and this region is oxidized to form the thick dielectric layer 38. Thereby, even if the oxidized part expands, strain is relieved by the trenches 44. Hence, the warpage of the p-type silicon substrate 10 can be prevented.

Also in the present embodiment, a thick dielectric layer 54 is also formed in the n⁻-type semiconductor layer 14. Thereby, a part of potential during applying the forward blocking voltage of the device can be maintained also in the n⁻-type semiconductor layer 14 side. Therefore, a high withstand voltage can be stably obtained, and the freedom of designing can be elevated.

The width W1 of the thick dielectric layer 54 is larger than the width of the p⁺-type collector diffusion layer 56. Thereby, since the potential is preferentially led into the thick dielectric layer 54, the elongation of the depletion layer into the p⁺-type collector diffusion layer 56 can be prevented, and stable withstand voltage characteristics can be realized.

The width W2 of the thick dielectric layer 38 is the same with or larger than the width W1 of the thick dielectric layer 54. Thereby, the concentration of potential during applying blocking voltage can be relieved.

The length γ from the thick dielectric layer 54 to the upper surface of the p⁺-type collector diffusion layer 56 and the impurity concentration N in the n⁻-type layer have the relationship of $\gamma \times N < 1.2\,E\,12\,cm^{-2}$. Thereby, the RESURF effect can be maintained, the elongation of potential when applying the blocking voltage can be secured to realize stable withstand voltage characteristics.

Figure 19:
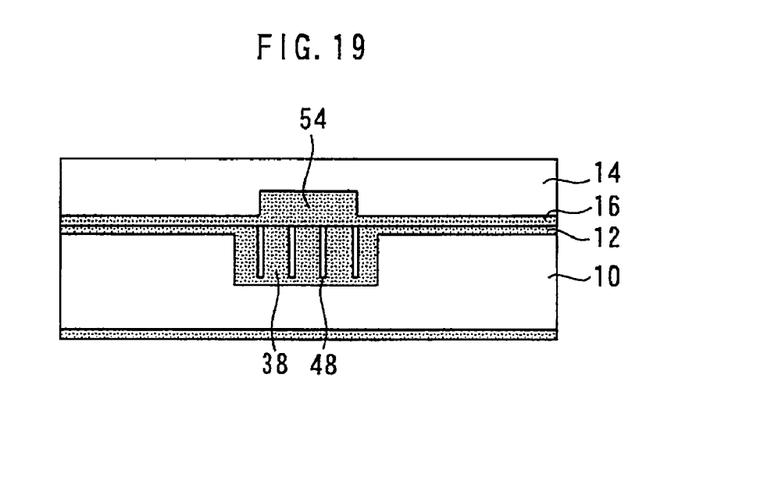
FIG. 19 is a sectional view for illustrating a modification of the method for manufacturing the dielectric isolation type semiconductor device according to the third embodiment.

FIG. 19 is a sectional view for illustrating a modification of the method for manufacturing the dielectric isolation type semiconductor device according to the third embodiment. Thus in the thick dielectric layer 38, a plurality of trenches 44 may be slightly left as voids 48. Thereby, the bonding state of the p-type silicon substrate 10 and the n⁻-type semiconductor layer 14 can be improved, and the bonding intensity can be elevated. In addition, a plurality of trenches 52 can be slightly left in the thick dielectric layer 54 as voids 48.

Fourth Embodiment

Figure 20:
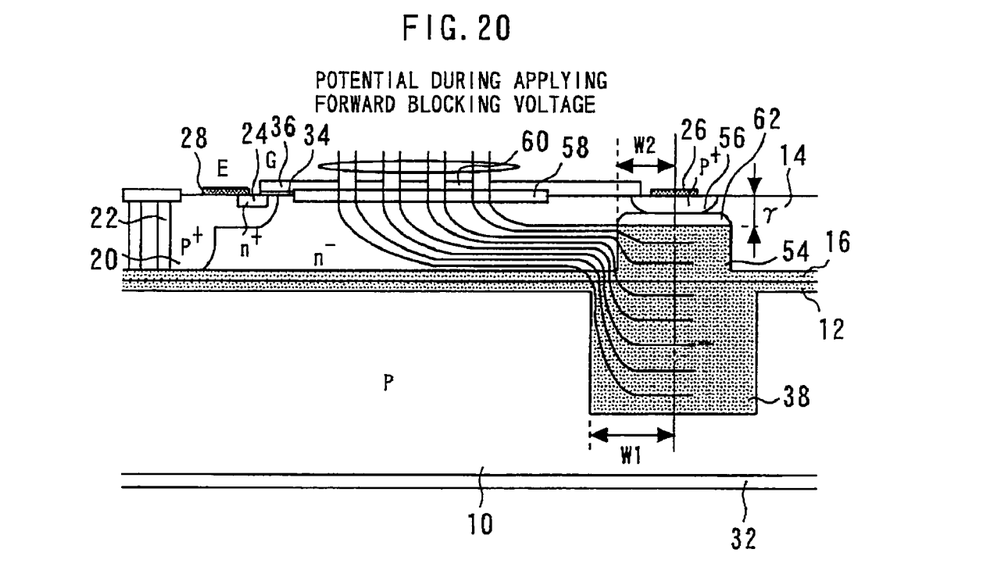
FIG. 20 is a sectional view for illustrating the method for manufacturing a dielectric isolation type semiconductor device according to the fourth embodiment.

FIG. 20 is a sectional view for illustrating the method for manufacturing a dielectric isolation type semiconductor device according to the fourth embodiment. In the present embodiment, as shown in FIG. 20, when the p⁺-type collector diffusion layer 56 is formed, an n⁻-type buffer layer 62 is formed between the p⁺-type collector diffusion layer 56 and the thick dielectric layer 54. Others are the same as in the third embodiment. Thereby, when the blocking voltage is applied, since the elongation of the depletion layer can be stopped at the edge of the n⁻-type buffer layer 62, the elongation of the depletion layer to the p⁺-type collector diffusion layer 56 can be prevented, and stable withstand voltage characteristics can be realized.

Fifth Embodiment

Figure 21:
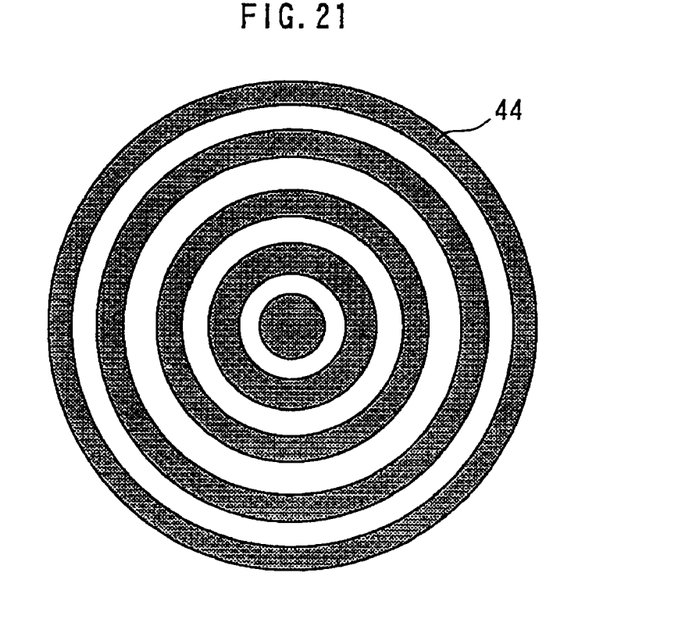
FIGS. 21 and 22 are plan views for illustrating a method for manufacturing a dielectric isolation type semiconductor device according to the fifth embodiment.
Figure 22:
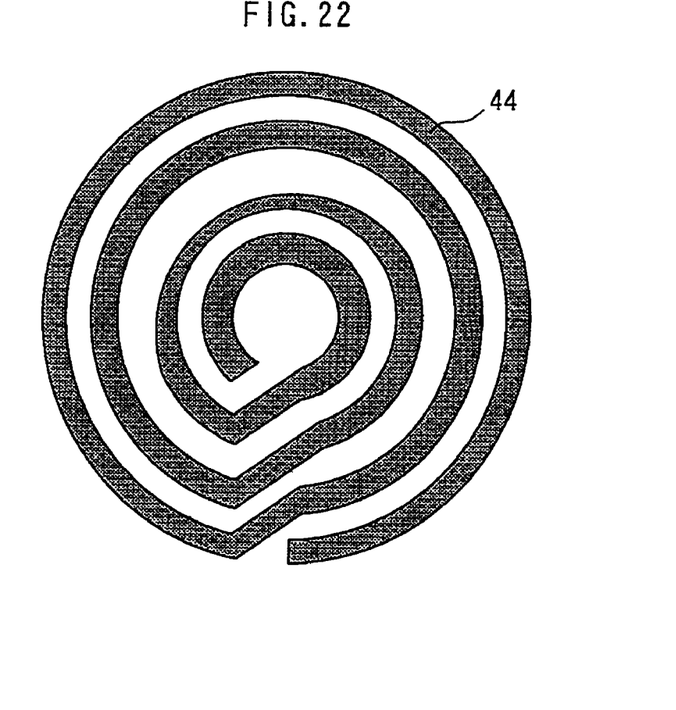

FIGS. 21 and 22 are plan views for illustrating a method for manufacturing a dielectric isolation type semiconductor device according to the fifth embodiment. In the present embodiment, in the manufacturing process according to the first to fourth embodiments, a plurality of trenches 44 to 52 are concentrically formed as shown in FIG. 21, or spirally formed as shown in FIG. 22. The width of the openings and the non-openings of the trenches 44 and 52 are constant toward the center.

Thereby, stress applied in grinding and polishing after oxidation can be diffused. Therefore, the deformation and breakdown of the thick dielectric layers 38 and 54 can be prevented, and the adhesiveness of the bonding surfaces can be improved by equalizing pressures during bonding. The equivalent effect can be obtained when the shapes of a plurality of trenches 44 and 52 are of a combined pattern wherein a concentric or spiral pattern is combined with a linear pattern.

Although the above-described first to fifth embodiments were described for the cases of the n-channel MOS transistor or the re-channel IGBT, the present invention is not limited thereto, but can be also applied to p-channel MOS transistors or p-channel IGBT.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-110892, filed on May 13, 2010 including specification, claims, drawings and summary, on which the Convention priority of the present application is based, are incorporated herein by reference in its entirety.

What is claimed is:

1. A method for manufacturing a dielectric isolation type semiconductor device comprising:
   forming a plurality of trenches in a first region located on a major surface of a semiconductor substrate;
   forming a first dielectric layer on the major surface of the semiconductor substrate and a first thick dielectric layer in the first region by oxidizing a surface of the semiconductor substrate;
   bonding a semiconductor layer of a first conductive type to the semiconductor substrate via the first dielectric layer;
   forming a first semiconductor region by implanting an impurity into a part of the semiconductor layer above the first thick dielectric layer;
   forming a second semiconductor region by implanting an impurity of a second conductive type into a part of the semiconductor layer so as to surround and to be separated from the first semiconductor region;
   forming a first main electrode connected to the first semiconductor region;
   forming a second main electrode connected to the second semiconductor region;
   forming a lower electrode on a lower surface of the semiconductor substrate; and
   forming a plurality of trenches in a second region located on a major surface of the semiconductor layer;
   forming a second dielectric layer on the major surface of the semiconductor layer and a second thick dielectric layer in the second region by oxidizing a surface of the semiconductor layer; and
   performing alignment so that the first thick dielectric layer and the second thick dielectric layer face one another; and
   joining the first dielectric layer and the second dielectric layer, when the semiconductor layer is bonded to the semiconductor substrate.

2. The method for manufacturing a dielectric isolation type semiconductor device according to claim 1, wherein the plurality of trenches are left on the first thick dielectric layer as voids.

3. The method for manufacturing a dielectric isolation type semiconductor device according to claim 1, wherein a width of the second thick dielectric layer is larger than a width of the first thick dielectric layer.

4. The method for manufacturing a dielectric isolation type semiconductor device according to claim 1, wherein a width of the first thick dielectric layer is the same with or larger than a width of the second thick dielectric layer.

5. The method for manufacturing a dielectric isolation type semiconductor device according to claim 1, wherein length γ from the second thick dielectric layer to an upper surface of the first semiconductor region and impurity concentration N in the semiconductor layer have a relationship of $\gamma \times N < 1.2 \text{ E } 12 \text{ cm}^{-2}$.

6. The method for manufacturing a dielectric isolation type semiconductor device according to claim 1, wherein the first semiconductor region is the second conductive type, and
   when the first semiconductor layer is formed, a buffer layer of the first conductive type is formed between the first semiconductor layer and the second thick dielectric layer.

7. The method for manufacturing a dielectric isolation type semiconductor device according to claim 1, wherein the plurality of trenches are concentrically or spirally formed.

* * * * *